US012563845B2

(12) United States Patent
Peng et al.

(10) Patent No.: US 12,563,845 B2
(45) Date of Patent: Feb. 24, 2026

(54) METHOD FOR ACTIVATING AN ABSORBER LAYER OF A THIN-FILM SOLAR CELL

(71) Applicants:China Triumph International Engineering Co., Ltd., Shanghai (CN); CTF Solar GmbH, Dresden (DE)

(72) Inventors: Shou Peng, Shanghai (CN); Ganhua Fu, Shanghai (CN); Liyun Ma, Shanghai (CN); Xinjian Yin, Shanghai (CN); Christian Drost, Dresden (DE)

(73) Assignees: China Triumph International Engineering Co., Ltd., Shanghai (CN); CTF Solar Gmbh, Dresden (DE)

( * ) Notice: Subject to any disclaimer, the term of this patent is extended or adjusted under 35 U.S.C. 154(b) by 5 days.

(21) Appl. No.: 18/711,885

(22) PCT Filed: Jun. 10, 2022

(86) PCT No.: PCT/CN2022/098045
§ 371 (c)(1),
(2) Date: May 21, 2024

(87) PCT Pub. No.: WO2023/092995
PCT Pub. Date: Jun. 1, 2023

(65) Prior Publication Data
US 2025/0015219 A1    Jan. 9, 2025

(30) Foreign Application Priority Data
Nov. 23, 2021    (CN) .......................... 202111393768.6

(51) Int. Cl.
H10F 10/162        (2025.01)
H10F 71/00        (2025.01)

(52) U.S. Cl.
CPC ......... H10F 10/162 (2025.01); H10F 71/125 (2025.01); H10F 71/128 (2025.01)

(58) Field of Classification Search
None
See application file for complete search history.

(56) References Cited

FOREIGN PATENT DOCUMENTS

| CN | 108604617 A | 9/2018 |
| CN | 110098331 A | 8/2019 |

(Continued)

OTHER PUBLICATIONS

J. Huang, et al., Thermal decomposition mechanisms of poly(vinyl chloride): A computational study, Waste Management 76, p. 483-496 (Year: 2018).*

*Primary Examiner* — Ryan S Cannon
(74) *Attorney, Agent, or Firm* — IPRTOP LLC

(57)        ABSTRACT

The invention refers to a method for activating an absorber layer of a semi-finished thin-film solar cell. The absorber layer comprises $CdSe_xTe_{1-x}$, CdSe, CdS or CdTe. The method comprises the steps of providing a semi-finished thin-film solar cell with an absorber layer comprising a $CdSe_xTe_{1-x}$, layer or comprising at least two layers selected from CdS, CdTe, ZnTe, CdSe, forming a polyvinylchloride film on a surface of the absorber layer, and performing a heat treatment of the semi-finished thin-film solar cell with the polyvinylchloride film on it, wherein the temperature is in the range of 300° C. to 500° C.

9 Claims, 2 Drawing Sheets

(56)     References Cited

FOREIGN PATENT DOCUMENTS

| CN | 112768558 A | 5/2021 | |
| JP | H09232607 A | 9/1997 | |
| WO | 2012063078 A | 5/2012 | |
| WO | 2020057484 A | 3/2020 | |
| WO | WO-2021012242 A1 * | 1/2021 | ........... H10F 71/125 |

\* cited by examiner

METHOD FOR ACTIVATING AN ABSORBER LAYER OF A THIN-FILM SOLAR CELL

TECHNICAL FIELD

The present invention refers to a method of activating an absorber layer of a CdTe or CdSeTe thin-film solar cell without the use of $CdCl_2$.

BACKGROUND

According to the state of the art, producing superstrate configuration thin-film solar cells having an absorber layer comprising $CdSe_xTe_{1-x}(0 \leq x \leq 4$ μm) involves applying a transparent front contact layer (TCO, i.e. transparent conductive oxide) onto a substrate (preferably glass). The front contact layer may also be a layer stack consisting of several different layers. Onto this, a layer of pure or modified CdS (cadmium sulfide) may be deposited. Modified CdS (cadmium sulfide) is henceforth understood as CdS with dopings, variations in crystal shape or in grain sizes, or as a mixture of CdS with other substances. However, this CdS layer may also be omitted. On top of the CdS layer or on top of the transparent front contact layer, an absorber layer of CdTe (cadmium telluride) or $CdSe_xTe_{1-x}$ (cadmium selenide telluride) is applied. Onto the absorber layer in turn the back contact layer, or back layer sequence, is deposited.

During the production process, after applying the CdTe or $CdSe_xTe_{1-x}$, in the state of the art usually an activation of the absorber layer follows by means of $CdCl_2$ and heating. To this end, a $CdCl_2$ layer is applied to the absorber layer using methods according to the state of the art, e.g. wet-chemical methods, CVD (chemical vapour deposition) or PVD (physical vapour deposition). Afterwards, the $CdCl_2$ is left to react with the absorber layer at a raised temperature, usually about 380° C. to 430° C. Reaction time is about 15 minutes to 45 minutes. Here the $CdCl_2$ acts as fluxing agent and supports a recrystallisation of the CdTe or $CdSe_xTe_{1-x}$ layer.

After activation, any surplus $CdCl_2$ is rinsed off from the surface of the absorber layer using deionized water. A problem arising from the activation process according to the state of the art is that CdCl2 is an easily water-soluble, toxic chemical and highly hazardous for the environment. It is proven to have carcinogenic and mutagenic properties and to be toxic for reproduction. These properties require special care in handling when processing the $CdCl_2$ in the production process. Furthermore, the generated contaminated waste water requires costly cleaning or waste disposal.

Therefore, other substances were investigated, which could replace the $CdCl_2$ necessary for achieving activation of the absorber layer comprising $CdSe_xTe_{1-x}$ and for achieving good electrical characteristics of produced thin-film solar cells.

In U.S. Pat. No. 9,287,439 B1, calcium chloride, zinc chloride hydrate, adducts of zinc chloride, in particular tmeda-$ZnCl_2$ (tmeda: tetramethylethylenediamine), and tetrachlorozincates, particularly $(NH4)_2ZnCl_4$, and further double salts containing zinc and chloride ions were investigated. Most of these compounds turned out to be not suitable for replacing $CdCl_2$. Only calcium tetrachlorozincate has proven suitable.

Further, hypochlorites of sodium, calcium or other alkaline or earth alkaline metals has been investigated in WO 2018/119679 A1, wherein calcium hypochlorite $(Ca(OCl)_2)$ has proven suitable.

WO 2011/045728 A1 describes a method, wherein the absorber layer is treated with a mixture formed by a fluorine-free chlorinated hydrocarbon and by a chlorine-free fluorinated hydrocarbon.

EP 1176644 A1 discloses a method using a gaseous mixture of hydrogen chloride, nitrogen and oxygen for activation.

However, all the previous attempts have drawbacks in handling, e.g. using gaseous hydrogen chloride, or in the achieved electrical properties of the resulting solar cells.

SUMMARY

Thus, the object of the present invention consists in providing a further alternative method in which the $CdCl_2$ is replaced with a safer, and easier to handle substance.

Furthermore, the overall method of producing a CdTe or CdSeTe thin-film solar cell should be maintained.

According to the invention, the object is achieved using the method according to claim 1. Advantageous embodiments are disclosed in the corresponding dependent subclaims.

The method according to the present invention comprises the steps of providing a semi-finished thin-film solar cell, forming a polyvinylchloride film, and performing a heat treatment. The semi-finished solar cell comprises an absorber layer comprising $CdSe_xTe_{1-x}$, wherein $0 \leq x \leq 0.99$, and the absorber layer may also be a layer stack comprising different material layers. The layer stack may—among other materials—comprise at least two layers selected from CdS, CdTe, ZnTe, CdSe. This is beneficial, as during activation, these stacked layers may intermix, leading to the formation of an absorber layer comprising $CdSe_xTe_{1-x}$ or the recrystallization of layers in different alloying states and mixing ratios. In some embodiments, the semi-finished solar cell can therefore also comprise an absorber layer comprising CdSe, CdS or CdTe. The absorber layer is adjacent to a surface of the semi-finished thin-film solar cell, i.e. a surface of the absorber layer lies open and can be treated. On this surface of the absorber layer, the polyvinylchloride film is formed. The heat treatment is performed when the polyvinylchloride film is formed on the absorber layer, wherein the temperature is in the range of 300° C. to 500° C. Due to the temperature treatment, the polyvinylchloride film decomposes and the released hydrogen chloride ($H^+Cl^-$) may enter the absorber layer via the surface and/or the grain boundaries and initiate the activation process.

Although the polyvinylchloride (PVC) starts to decompose already at a temperature around 200° C., the heat treatment step may be performed at least at 300° C. in order to fully decompose the polyvinylchloride film in an acceptable period of time. Furthermore, recrystallization processes within the absorber layer, which are part of the activation process, perform better at higher temperatures. On the other hand, the temperature may not rise above 500° C. during heat treatment in order to avoid negative effects on other films already present in the semi-finished thin-film solar cell, e.g. transparent conductive oxides or a glass substrate. In embodiments, the temperature is in the range between 380° C. and 450° C. during heat treatment. The heat treatment may be performed for a time in the range of 5 minutes to 30 minutes.

Since polyvinylchloride is less toxic and hazardous for the environment as $CdCl_2$, safety requirements are less. Furthermore, products resulting from its decomposition may be treated with normal filter units already present in the process apparatuses used for fabricating $CdSe_xTe_{1-x}$ thin-film solar cells.

In embodiments of the inventive method, the polyvinylchloride film is formed by applying a solid sheet of polyvinylchloride on the surface of the absorber layer. The sheet of polyvinylchloride may be provided from a roll and applied to the surface of the absorber layer by a roller. The sheet of polyvinylchloride may have a thickness in the range of 10 μm to 500 μm.

In alternative embodiments, the polyvinylchloride film is formed by applying a solvent in which the polyvinylchloride is dissolved, followed by drying of the film. The solvent may be an organic solvent, for instance tetrahydrofuran or dimethylformamide, or any other suitable solvent. The solvent may be applied using a roller coater, a spin coater, a scraper, or a spray coater. Drying may be performed at elevated temperatures, for instance 100° C., or at room temperature (between 18° C. and 30° C.) and results in transforming the liquid or pasty solvent film into a solid film or essentially solid film of polyvinylchloride by evaporation or sublimation of the solvent part. The temperature during drying may be below 200° C. in order to prevent decomposition of the polyvinylchloride at this process stage.

In any case, the surface of the absorber layer may be cleaned before forming the polyvinylchloride film on it. Cleaning agents known from the prior art, e.g. isopropanol, or plasma cleaning processes can be used.

In embodiments, the method further comprises a cleaning step performed after the heat treatment in order to remove organic residues resulting from the decomposed polyvinylchloride film. At least one of the group comprising an aqueous inorganic acid, an organic complexing agent, an organic complexing acid, a mechanical cleaning device, a water jet or ultra sound may be used for cleaning the surface of the activated absorber layer. An aqueous inorganic acid may be, for instance, hydrochloric acid, nitric acid, phosphoric acid, hydroiodic acid or a mixture of some or all of these acids. An organic complexing agent may be, for instance, ethylenediamine or ethylenediaminetetraacetate (EDTA). An organic complexing acid may be, for instance, citric acid or tartaric acid. A mechanical cleaning device may comprise, for instance, soft brushes. Furthermore, the cleaning step may comprise rinsing using deionized water, and a drying step.

Afterwards, the semi-finished thin-film solar cell may be treated further in order to fabricate a finished thin-film solar cell. Structuring processes, doping processes, temperature treatment processes and processes for forming a back contact layer (or back contact layer stack) may be performed. These processes are known to a person skilled in the art.

BRIEF DESCRIPTION OF THE DRAWINGS

The accompanying drawings are included to provide a further understanding of the invention and are incorporated in and constitute a part of this specification. The drawings illustrate an embodiment of the present invention and together with the description serve to explain the principles. Other embodiments of the invention are possible and lie within the scope of the invention. The elements of the drawings are not necessarily to scale relative to each other. Like reference numbers designate corresponding similar parts.

DETAILED DESCRIPTION OF THE PREFERRED EMBODIMENTS

Figure 1:
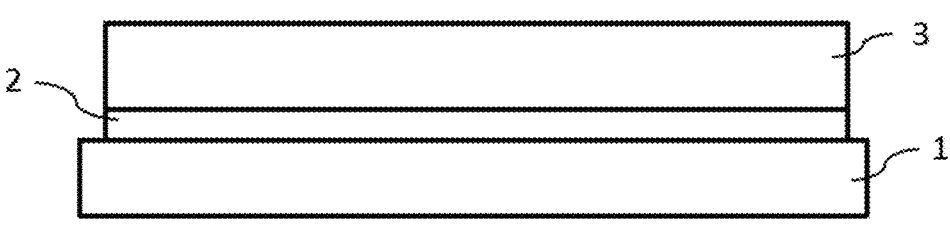
FIGS. 1 to 5 schematically show the sequence of process steps, including the activation step according to the invention using polyvinylchloride.

FIG. 1 shows the semi-finished thin-film solar cell with a substrate (1), onto which a transparent front contact (2), and an absorber layer (3) comprising $CdSe_xTe_{1-x}$ on top of it have already been applied.

Figure 2:
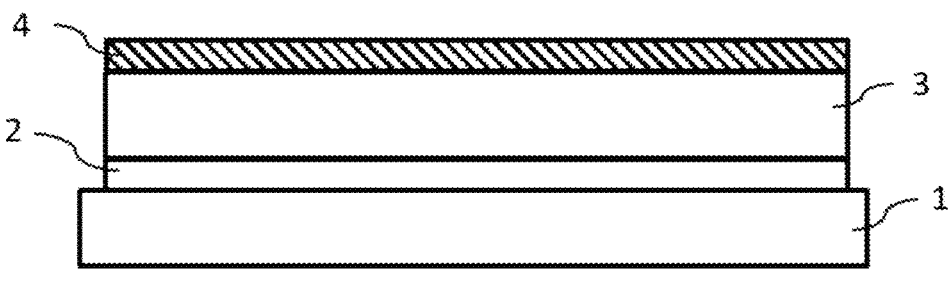

FIG. 2 schematically shows a polyvinylchloride film (4) formed on the absorber layer (3). The polyvinylchloride film (4) is formed by applying a polyvinylchloride sheet having a thickness of 500 μm with a roller. At this stage, the semi-finished thin-film solar cell is at room temperature Then, the semi-finished thin-film solar cell is heated to a temperature of 400° C. and held at this temperature for 25 min for performing an activation process.

Figure 3:
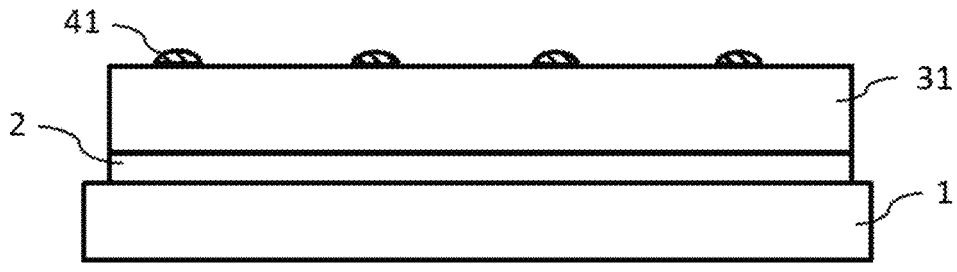

As schematically shown in FIG. 3, an activated absorber layer (31) remains after the activation process. The polyvinylchloride film is fully decomposed, but some residuals (41) have been left.

After cooling down the semi-finished thin-film solar cell, a cleaning step follows.

Figure 4:
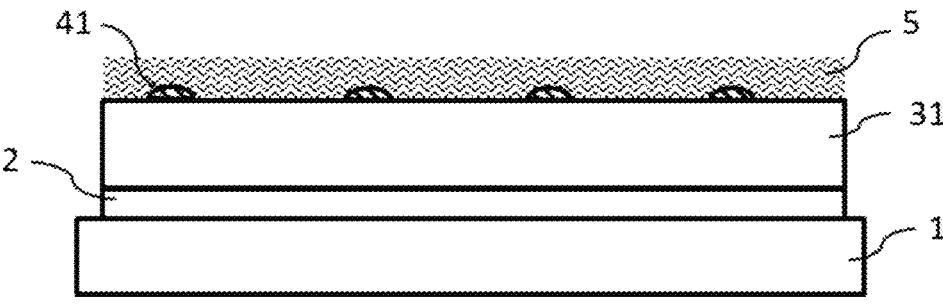

FIG. 4 schematically shows the cleaning step after the activation process. Here, a cleaning solution (5) containing dimethylformamide (DMF) is used to remove residuals (41) of the polyvinylchloride film. The cleaning step is carried out at a temperature of 20° C. for 30 seconds. To this end, the semi-finished thin-film solar cell is dipped into the cleaning solution (5) (DMF 50% to 100%).

Figure 5:
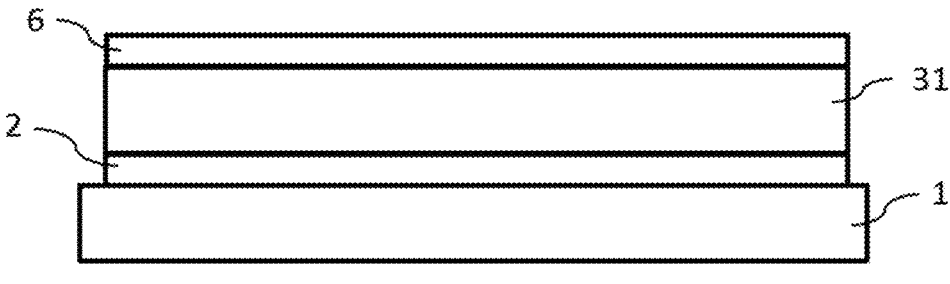

FIG. 5 schematically shows the layer sequence of the finished solar cell after applying a back contact (6) onto the activated absorber layer (31).

The embodiments of the invention described in the foregoing description are examples given by way of illustration and the invention is nowise limited thereto. Any modification, variation and equivalent arrangement as well as combinations of embodiments should be considered as being included within the scope of the invention.

REFERENCE NUMERALS

1 Substrate
2 Front contact
3 Absorber layer
31 Activated absorber layer
4 Polyvinylchloride film
5 Cleaning solution
6 Back contact

What is claimed is:

1. A method for activating an absorber layer of a semi-finished thin-film solar cell, the absorber layer comprising $CdSe_xTe_{1-x}$, CdSe, CdS or CdTe, the method comprising the steps of providing a semi-finished thin-film solar cell with an absorber layer comprising a $CdSe_xTe_{1-x}$, layer or comprising at least two layers selected from CdS, CdTe, ZnTe, CdSe, forming a polyvinylchloride film on a surface of the absorber layer, and performing a heat treatment of the semi-finished thin-film solar cell with the polyvinylchloride film on it, wherein the temperature is in the range of 300° C. to 500° C.

2. The method of claim 1, characterized in that the polyvinylchloride film is formed by applying a solid sheet of polyvinylchloride on the surface of the absorber layer.

3. The method of claim 1, characterized in that the polyvinylchloride film is formed by applying a solvent in which the polyvinylchloride is dissolved.

4. The method of claim 3, characterized in that the solvent is an organic solvent.

5. The method of 1, characterized in that the method further comprises a cleaning step performed after the heat treatment in order to remove organic residuals resulting from the decomposed polyvinylchloride film.

6. The method of claim 5, characterized in that at least one of the group comprising an aqueous inorganic acid, an organic complexing agent, an organic complexing acid, a mechanical cleaning device, a water jet, ultra sound or plasma clean is used within the cleaning step.

7. The method of claim 2, characterized in that the method further comprises a cleaning step performed after the heat treatment in order to remove organic residuals resulting from the decomposed polyvinylchloride film.

8. The method of claim 3, characterized in that the method further comprises a cleaning step performed after the heat treatment in order to remove organic residuals resulting from the decomposed polyvinylchloride film.

9. The method of claim 4, characterized in that the method further comprises a cleaning step performed after the heat treatment in order to remove organic residuals resulting from the decomposed polyvinylchloride film.

* * * * *